(12) United States Patent  (10) Patent No.: US 7,712,927 B2
Shuai et al.  (45) Date of Patent: May 11, 2010

(54) LED LAMP WITH IMPROVED HEAT DISSIPATING STRUCTURE

(75) Inventors: Chun-Jiang Shuai, Shenzhen (CN); Guang Yu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 261 days.

(21) Appl. No.: 12/036,301

(22) Filed: Feb. 25, 2008

(65) Prior Publication Data

US 2009/0147518 A1 Jun. 11, 2009

(30) Foreign Application Priority Data

Dec. 7, 2007 (CN) .................. 2007 1 0124923

(51) Int. Cl.
*F21V 29/00* (2006.01)
*H05K 7/00* (2006.01)
*B60Q 1/06* (2006.01)

(52) U.S. Cl. .................. 362/294; 362/249.02; 362/373; 362/218; 362/800

(58) Field of Classification Search ................. 362/218, 362/249.02, 294, 373, 800
See application file for complete search history.

(56) References Cited

U.S. PATENT DOCUMENTS

| D573,290 S | * | 7/2008 | Shuai et al. .................. D26/67 |
| 7,458,706 B1 | * | 12/2008 | Liu et al. ..................... 362/373 |
| 7,581,856 B2 | * | 9/2009 | Kang et al. .................. 362/373 |
| 2009/0021944 A1 | * | 1/2009 | Lee et al. ..................... 362/294 |
| 2009/0129102 A1 | * | 5/2009 | Xiao et al. .................. 362/373 |
| 2009/0147520 A1 | * | 6/2009 | Liu et al. ..................... 362/294 |

* cited by examiner

*Primary Examiner*—Stephen F Husar
*Assistant Examiner*—James W Cranson
(74) *Attorney, Agent, or Firm*—Frank R. Niranjan

(57) ABSTRACT

An LED lamp includes a top cover, a heat sink, and a conducting member, a plurality of light bars and a light cover. The top cover has a plate and a head extending upwardly from a centre of the plate. The heat sink has a conducting tube coupled to the plate of the top cover and a plurality of fins extending outwardly from the conducting tube. The conducting member is received in and thermally contacts with the conducting tube, and has a top surface attached to the plate and an inner surface on which the plurality of light bars are mounted. The inner surface is oriented downwardly and concaved from a bottom of the conducting member. Each light bar has a printed circuit board and a plurality of LEDs thereon.

16 Claims, 4 Drawing Sheets

LED LAMP WITH IMPROVED HEAT DISSIPATING STRUCTURE

BACKGROUND OF THE INVENTION

1. Field of the Invention

The present invention relates to a light emitting diode (LED) lamp, and more particularly to an LED lamp incorporating a heat dissipating structure.

2. Description of related art

As an energy-efficient light, an LED lamp has a trend of substituting for the fluorescent lamp for indoor lighting purpose; in order to increase the overall lighting brightness, a plurality of LEDs are often incorporated into a signal lamp, in which how to efficiently dissipate heat generated by the plurality of LEDs becomes a challenge.

Conventionally, an LED lamp being used in street illumination comprises a planar metal board functioning as a heat sink and a plurality of LEDs mounted on a common side of the board. The LEDs are arranged in a matrix that comprises a plurality of mutually crossed rows and lines. When the LEDs are activated to lighten, heat generated by the LEDs is dispersed to ambient air via the board by natural air convection.

However, in order to achieve a higher lighting intensity, the LEDs are arranged into a number of crowded groups, whereby the heat generated by the LEDs is concentrated at discrete spots, which leads to an uneven heat distribution over the board. The conventional board is not able to dissipate the locally-concentrated and unevenly-distributed heat timely and efficiently, whereby a heat accumulation occurs in the board easily. Such a heat accumulation may cause the LEDs to overheat and to have an unstable operation or even a malfunction.

What is needed, therefore, is an LED lamp which can overcome the above-mentioned disadvantages.

SUMMARY OF THE INVENTION

An LED lamp includes a top cover, a heat sink, a conducting member, a plurality of light bars and a light cover. The top cover has a plate and a head extending upwardly from a centre of the plate. The head is used for connecting with a supporting rod so that the LED lamp can be used as a pendant lamp. The heat sink has a conducting tube coupled to the plate of the top cover and a plurality of fins extending outwardly from the conducting tube. The conducting member is received in and thermally contacts with the conducting tube, and has a top surface securely attached to the plate and an inner surface on which the plurality of light bars are mounted. The inner surface is a concave surface recessed from a bottom of the conducting member. Each light bar has a printed circuit board and a plurality of LEDs mounted on the printed circuit board. The light cover is glued to a rim of the inner surface of the conducting member to cover the light bars.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
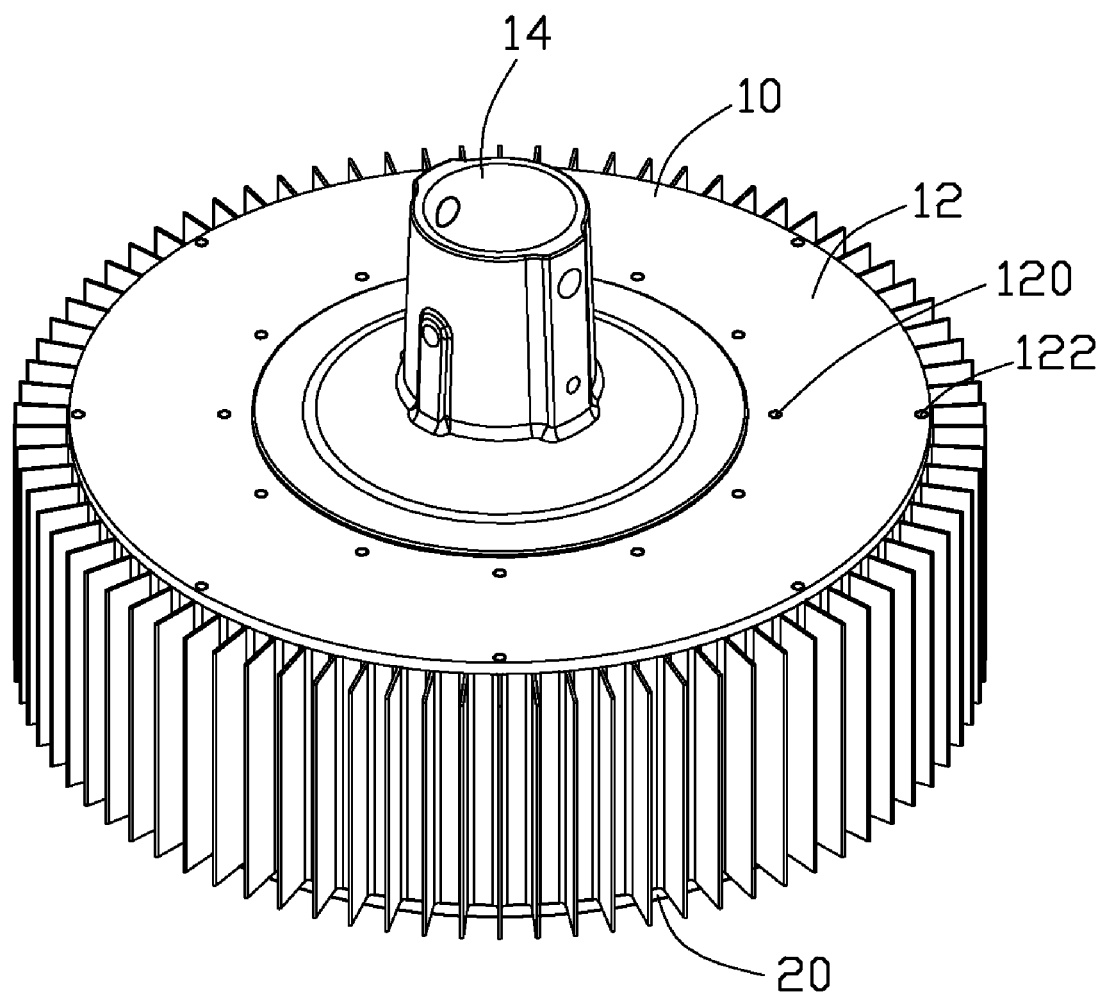
FIG. 1 is an assembled, isometric view of an LED lamp in accordance with a preferred embodiment of the present invention.
Figure 2:
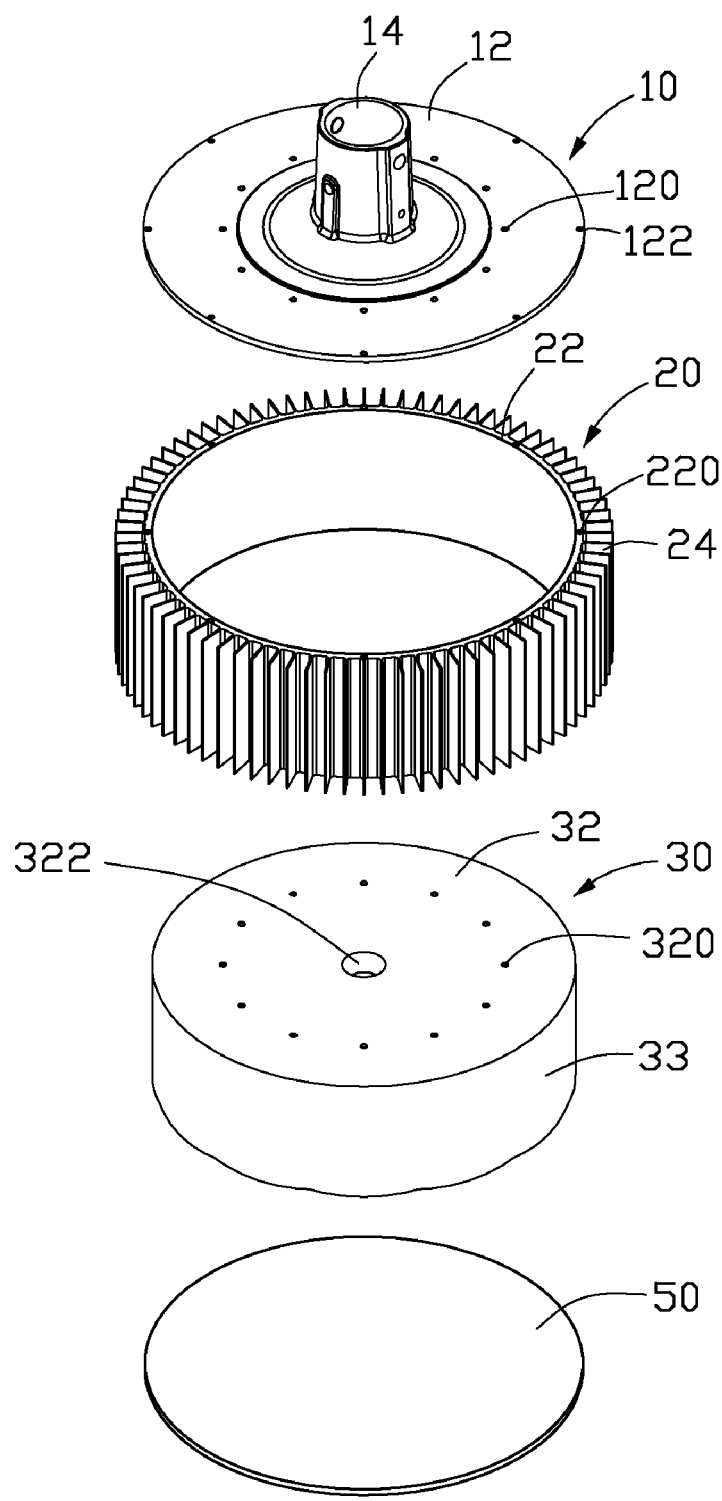
FIG. 2 is an exploded view of FIG. 1.

Referring to FIGS. 1-4, an LED lamp in accordance with a preferred embodiment of the present invention is used in such occasions that need high lighting intensity, such as street, gymnasium, court and so on.

The LED lamp comprises a top cover 10, an annular heat sink 20 having a top end connected to the top cover 10, a conducting member 30 received in the heat sink 20, a plurality of light bars 40 attached an inner, lower surface of the conducting member 30, and a light cover 50 coupled to a bottom end of the heat sink 20 and enclosing the light bars 40 in the conducting member 30.

The top cover 10 is configured to connect with a supporting rod (not shown) so that the LED lamp can be used as a pendant lamp. The top cover 10 comprises a circular plate 12 and a head 14 located at a centre of the circular plate 12 and extending upwardly therefrom. The head 14 has two aligned transverse holes (not labeled) for facilitating the head 14 to be coupled to the supporting rod (not shown) by a pin (not shown). A plurality of fixing orifices 120 is defined in the circular plate 12 at a position surrounding and near the head 14. A plurality of fixing apertures 122 is defined in the circular plate 12 and located adjoining a rim of the circular plate 12.

The heat sink 20 is integrally made of metal with a good heat conductivity, such as aluminum, copper and alloy thereof. The heat sink 20 comprises a conducting tube 22 and a plurality of fins 24 extending outwardly and radially from an outer circumferential surface of the conducting tube 22. The conducting tube 22 has an outer diameter equal to that of the circular plate 12 of the top cover 10 and defines a plurality of engaging apertures 220 in a top thereof. The engaging apertures 220 are respectively in alignment with the fixing apertures 122 of the circular plate 12 for bringing screws (not shown) to extend through the fixing apertures 122 of the top cover 10 into the engaging apertures 220 to couple the top cover 10 and the heat sink 20 together. The fins 24 are spaced from each other with a predetermined distance and centrosymmetrical to each other relative to a central axis of the conducting tube 22.

The conducting member 30 is integrally made of metal with a good heat conductivity, such as copper and alloy thereof. The conducting member 30 is substantially columnshaped, configured to be snugly received in the conducting tube 22 of the heat sink 20. The conducting member 30 has a circular top plate 32 and an outer circumferential wall 33 extending downwardly from an edge of the top plate 32. The conducting member 30 defines a concave inner surface 34 oriented downwardly to the light cover 50. The conducting member 30 defines a through hole 322 in a centre of the top plate 32 for leading wires to extend therethrough to electrically connect the light bars 40 with a driving circuitry (not shown) received in the head 14 of the top cover 10. The conducting member 30 defines a plurality of engaging orifices 320 in the top plate 32, which surround the through hole 322. In assembly, screws (not shown) are brought to extend through the fixing orifices 120 of the top cover 10 to threadedly engage in the engaging orifices 320 of the conducting member 30, to thereby securely connect the top cover 10 and the conducting member 30 together. The inner surface 34 is separated into a plurality of sector-shaped zones. Surface of each of the sector-shaped zones is flattened for intimately contacting with one of the light bars 40. The conducting member 30 is so snugly received in the conducting tube 22 of the heat sink 20 that the circumferential wall 33 of the conducting member 30 is kept closely contact with an inner surface of the conducting tube 22. In order to enhance a heat transferring capability between the heat sink 20 and the conducting member 30, thermal grease is preferably used to fill a gap between the conducting member 30 and the heat sink 20.

Figure 3:
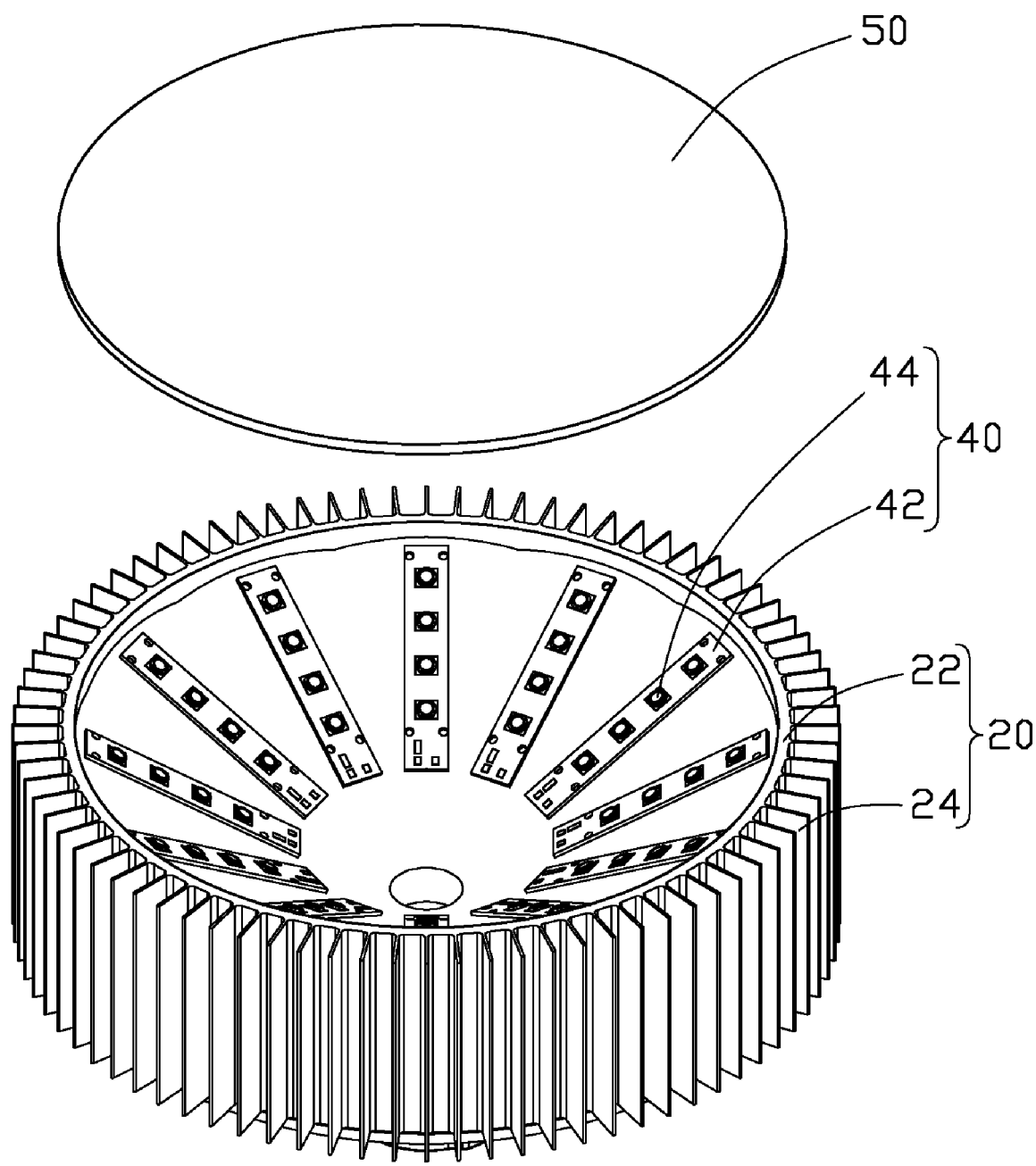
FIG. 3 is an inverted view of FIG. 1 with a light cover separating from the LED lamp.
Figure 4:
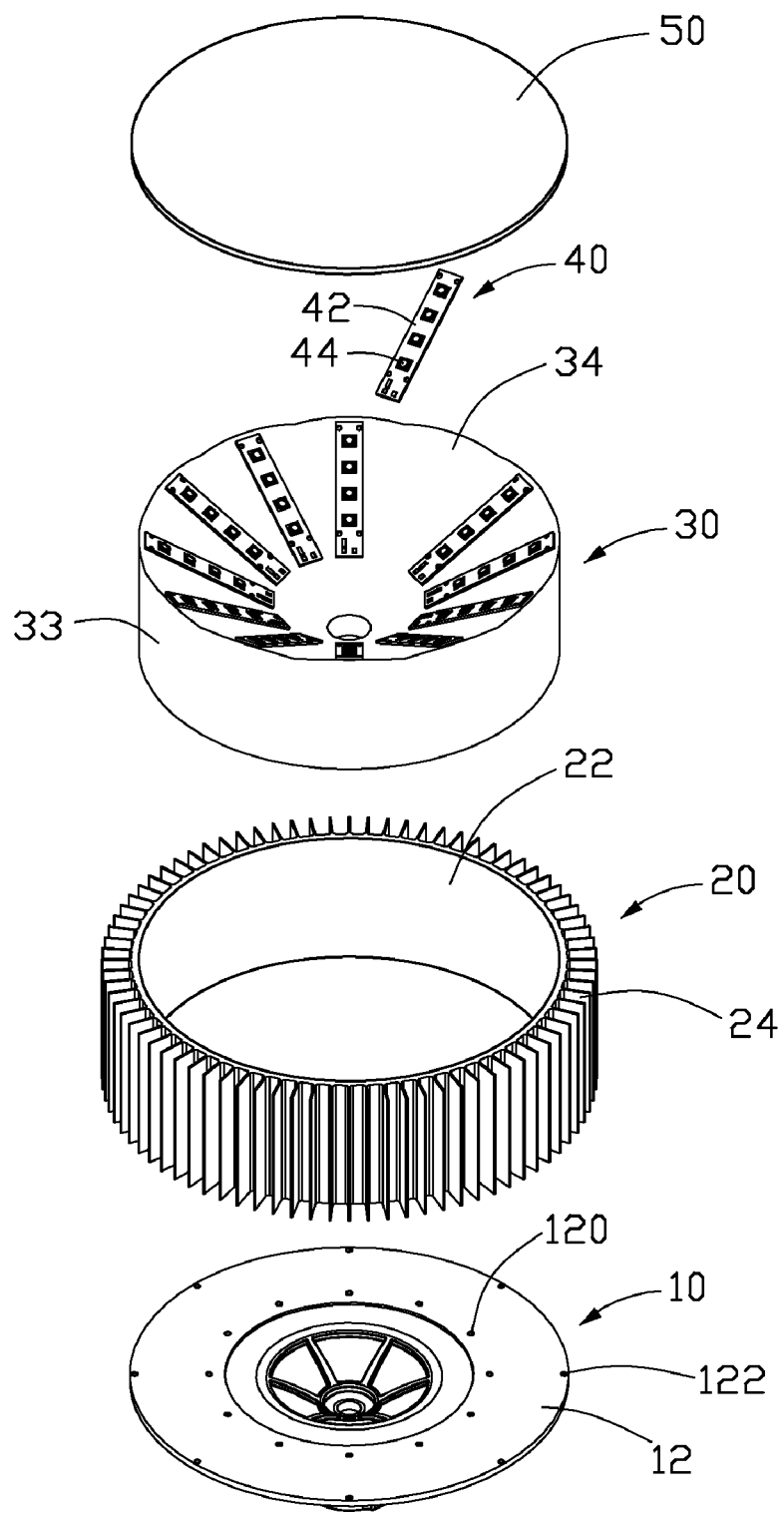
FIG. 4 is an inverted view of FIG. 2.

Particularly referring to FIG. 3 and FIG. 4, the light bars 40 are arranged at the bottom surface of the conducting member 30 in a radial direction. Each of the light bars 40 includes a strip-shaped printed circuit board 42 and an array of LEDs 44 mounted on the printed circuit board 42. Each of the light bars 40 is attached to one of the sector-shaped zones of the inner surface 34 of the conducting member 30 by adhering. Each light bar 40 is inclined, with an outer end (labeled) positioned below an inner end (not labeled) thereof.

The light cover 50 is made of a transparent material such as colophony, glass, etc, and has a form of a circular, thin plate. The light cover 50 is attached to a rim of the inner surface 34 of the conducting member 30 by adhering and fittingly received in a lower portion of the conducting tube 22 of the heat sink 20.

In assembly of the LED lamp, the screws extend through the fixing apertures 122 of the circular plate 12 of the top cover 10 and screw into the engaging apertures 220 in the top surface of the conducting tube 22 of the heat sink 20 to couple the top cover 10 and the heat sink 20 together. The screws extend through the fixing orifices 120 of the circular plate 12 of the top cover 10 and screw into the engaging orifices 320 of the conducting member 30 to couple the top cover 1 0 and the conducting member 30 together. The light bars 40 are respectively mounted to the sector-shaped zones of the inner surface 34 of the conducting member 30. The light cover 50 covers the bottom end of the conducting tube 22 of the heat sink 20 and thus encloses the light bars 40 in the conducting member 30 of the LED lamp.

In use, when the plurality of LEDs 44 are activated to lighten, heat generated by the LEDs 44 is conducted to the conducting member 30 via the printed circuit board 42. The heat accumulated in the conducting member 30 is timely and substantially transferred from the conducting tube 22 to the fins 24 to dissipate into ambient air, thus avoiding local concentrations and an uneven distribution of the heat occurring on the conducting member 30 and the heat sink 20. Therefore, the heat generated by the plurality of LEDs 44 is able to be dissipated to the ambient air via the heat sink 20 and the conducting member 30 sufficiently and rapidly; accordingly, the LEDs 44 can be maintained within their predetermined temperature range when in work.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp comprising:
    a top cover having a plate and a head extending upwardly from a centre of the plate;
    a heat sink having a conducting tube coupled to the plate of the top cover and a plurality of fins extending outwardly from the conducting tube;
    a conducting member received in and thermally contacting with the conducting tube, having a top surface attached to the plate of the top cover and an inner surface facing downwardly; and
    a plurality of LEDs are mounted on the inner surface of the conducting member.

2. The LED lamp as claimed in claim 1, wherein the inner surface of the conducting member is concaved from a bottom of the conducting member.

3. The LED lamp as claimed in claim 2, wherein the inner surface is separated into a plurality of sector-shaped zones, and each of the sector-shaped zones has an array of the LEDs arranged thereon.

4. The LED lamp as claimed in claim 3, wherein the conducting member defines a through hole in a centre thereof and a plurality of fixing orifices surrounding the through hole, the fixing orifices being adapted for threadedly receiving screws extending through the plate to couple the conducting member and the top cover together.

5. The LED lamp as claimed in claim 1, wherein the plate is circular and defines a plurality of fixing apertures adjoining a rim thereof, the fixing apertures being adapted for allowing screws to extend therethrough to screw into an upper end of the conducting tube to couple the heat sink and the top cover together.

6. The LED lamp as claimed in claim 1, wherein the fins extend radially outwardly from the conducting tube, with a predetermined space defined between two neighboring fins.

7. The LED lamp as claimed in claim 1, wherein thermal grease is used to fill in a gap between the conducting tube and the conducting member.

8. The LED lamp as claimed in claim 1, further comprising a light cover attached to a rim of the inner surface of the conducting member and covering a bottom portion of the conducting tube.

9. An LED lamp comprising:
    a plate;
    an annular conducting tube coupled to the plate and a plurality of fins extending outwardly from an outer circumferential surface of the conducting tube;
    a conducting member received in and thermally contacting with an inner surface of the conducting tube, having a top surface attached to the plate; and
    a plurality of light bars having a plurality of LEDs mounted thereon, attached to a concaved bottom surface of the conducting member.

10. The LED lamp as claimed in claim 9, wherein the light bars are arranged in a radial direction of the conducting member.

11. The LED lamp as claimed in claim 9, wherein the concaved bottom surface of the conducting member consists of a plurality of sector-shaped flat zones, each light bar being attached to a corresponding zone.

12. The LED lamp as claimed in claim 11, wherein each light bar is slantwise with an outer end located lower than an inner end thereof.

13. The LED lamp as claimed in claim 12, wherein the conducting member defines a through hole in a centre thereof and a plurality of fixing orifices surrounding the through hole adapted for threadedly receiving screws extending through the plate to thereby couple the conducting member and the top cover together.

14. The LED lamp as claimed in claim 9, wherein the plate defines a plurality of fixing apertures adjoining a rim thereof, adapted for extension of screws therethrough.

15. The LED lamp as claimed in claim 9, wherein the fins are extended radially from the conducting tube and cetrosymmetrical to each other relative to a central axis of the annular conducting tube.

16. The LED lamp as claimed in claim 9, wherein thermal grease is used to fill in a gap between the conducting tube and the conducting member.

* * * * *